United States Patent [19]

Terakado

[11] Patent Number: 5,183,531
[45] Date of Patent: Feb. 2, 1993

[54] DRY ETCHING METHOD

[75] Inventor: Shingo Terakado, Tsukuba, Japan

[73] Assignee: Sanyo Electric Co., Ltd., Osaka, Japan

[21] Appl. No.: 565,264

[22] Filed: Aug. 9, 1990

[30] Foreign Application Priority Data

| | | |
|---|---|---|
| Aug. 11, 1989 [JP] | Japan | 1-208095 |
| Mar. 27, 1990 [JP] | Japan | 2-77944 |
| Apr. 25, 1990 [JP] | Japan | 2-109110 |

[51] Int. Cl.$^5$ .............................................. H01L 21/00
[52] U.S. Cl. .................................... 156/643; 156/646; 156/662; 156/345
[58] Field of Search ............... 156/643, 345, 646, 662

[56] References Cited

U.S. PATENT DOCUMENTS

| | | | |
|---|---|---|---|
| 4,490,210 | 12/1984 | Chen et al. | 156/643 |
| 4,490,211 | 12/1984 | Chen et al. | 156/643 |
| 4,673,456 | 6/1987 | Spencer et al. | 156/646 |
| 4,687,544 | 8/1987 | Bersin | 156/643 |
| 4,728,620 | 3/1988 | Jeuch | 437/41 |
| 4,741,800 | 3/1988 | Yamazaki | 156/643 |
| 4,824,803 | 4/1989 | Us et al. | 437/189 |
| 4,885,047 | 12/1989 | Ury et al. | 156/345 |
| 4,941,942 | 7/1990 | Bruns et al. | 156/657 |
| 4,956,043 | 9/1990 | Kanetomoto et al. | 156/345 |

FOREIGN PATENT DOCUMENTS

| | | |
|---|---|---|
| 0175561 | 3/1986 | European Pat. Off. . |
| 63-74322 | 7/1988 | Japan . |
| 01-120051 | 5/1989 | Japan . |
| 01-162339 | 6/1989 | Japan . |
| 01-217921 | 8/1989 | Japan . |

OTHER PUBLICATIONS

"VUV-Assisted Etching of Silicon (100) and Poly(-Methyl Methacrylate)", *Japanese Journal of Applied Physics*, vol. 27, No. 9, Sep. 1988, pp. 1723-1726.

"Low Temperature Microwave Plasma Etching", *Extended Abstracts of the 20th International Conference on Solid State Devices and Materials*, Aug. 1988, pp. 553-556.

"Reaction Mechanisms with Synchrotron Radiation-Stimulated Etching of Si and SiO2", *Extended Abstracts of the 20th International Conference*, etc., pp. 73-76.

*Patent Abstracts of Japan*, vol. 9, No. 201, Aug. 1985, JP-A-60 65 533 "Microfabrication of WO3-Based Microelectrochemical Devices", *J. Appl. Phys.*, vol. 66, No. 2, Jul. 1989.

"Synchrotron Radiation-Assisted Etching of Silicon Surface", by Nobuo Hayanaka et al.; Jap. Jr. of Applied Physics; vol. 26, No. 7, Jul. 1987, pp. 1.1110-1.1112

*Primary Examiner*—Brian E. Hearn
*Assistant Examiner*—George Goudreau
*Attorney, Agent, or Firm*—Spensley Horn Jubas & Lubitz

[57] ABSTRACT

A dry etching method for etching a substrate such as semiconductors. A vacuum ultraviolet radiation or soft X-rays is used as a photon beam source for generating a reaction of dry etching, and also an etching gas in introduced into a reaction chamber after being activated by a microwave radiation, whereby a reaction of the etching gas with a substrate takes place at a region of the processing material to which the electromagnetic wave is irradiated, and a dry etching is accomplished at the region etched by the reaction of the etching gas.

2 Claims, 2 Drawing Sheets

DRY ETCHING METHOD

BACKGROUND OF THE INVENTION

1. Field of the Invention

This invention relates to a dry etching method, and is effective particularly when applied to manufacturing a semiconductor processing apparatus.

2. Description of Related Arts

An etching technique using a gas plasma, for example, represented by RIE (reactive ion etching) which utilizes an etching gas such as a fluorine compound or a chlorine compound is widely adopted as a basic technique for manufacturing various kinds of semiconductor devices in which Si is used as a substrate. For example, please refer to an article in Oyo Buturi [in Japanese], (Volume 53, No. 10, 1984, from page from 867).

In accordance with an improvement of the microfabrication technique of integrated circuits, damages caused by with bombarding high energy charged species have become a problem in etching, and therefore it has become necessary to improve the anisotropic property of ion etching and to reduce the damages simultaneously. However, there arises another problem that the substrate is much more impaired and the selectivity of the etching of the substrate against the mask is degraded if one uses high energy etching species to improve the anisotropic property of the etching.

For these reasons, a photochemical reaction process induced by a photon excitation which uses no high energy charged species has attracted attention. For example, please refer to Research Report of the Photo Excitation Process Technique 1 published by Japan Electronic Industry Development Association (61-M 255).

Nevertheless, with the further development of the microfabrication technique, visible radiation or ultraviolet radiation has a wavelength which is too long to be used for a processing requiring an etching profile width in the submicron scale. Therefore, a photon beam ranging from a vacuum ultraviolet radiation (hereinafter simply referred to as VUV) to soft X-rays now appears to be a promising technique because this beam has a shorter wavelength than that of the visible or the ultraviolet radiation and does not cause any troubles due to a diffraction effect. It is also expected that breakthrough characteristics, hard to be found from the prior art, would be discovered because inner-shell electrons are activated by photons in the range from VUV to soft X-rays. On this point, please refer to an article in Oyo Buturi [in Japanese] (Volume 56, No. 8, 1987, from page from 1035).

In general, it is considered as necessary for accomplishing an etching reaction to have the following steps of:

(A) activating reactive gas molecules by the transition from the reactive gas molecules to ions or neutral species (radicals); and (B) dissociating a reaction product, produced by the reaction of the etching species with a substrate, from the surface of a substrate.

In the etching using a photon beam as an etching reaction source, a beam energy is usually used for achieving the above-described reactions, yet there remains a problem that the etching rate is very low.

The principal object of this invention is to provide a method which enables a selective etching in a photon irradiated region, that is an etching having high spatial selective characteristics, and the etching, which causes less damage while maintaining an anisotropic etching, being accomplished at a high etching rate.

SUMMARY OF THE INVENTION

According to one aspect of the invention, a dry etching method is featured with the steps of activating an etching gas by using a microwave discharge, and irradiating a photon beam, for exciting/activating a reaction, onto a processing material to be etched in a condition that there exists an activated etching gas. Moreover, according to one embodiment of the present invention, a dry etching apparatus comprises a reaction chamber which is hermetically sealed; a vacuum pump connected to the reaction chamber; a generation portion for generating a gas plasma by the use of a microwave discharge led to the reaction chamber and activating the etching gas by the generated gas plasma; a supporting portion, provided in the reaction chamber, upon which a processing material to be etched is disposed; and a photon beam source for irradiating a photon beam onto the processing material to be etched which is disposed upon the supporting portion provided in the reaction chamber. A reactive gas causes a transition to the plasma state by the microwave discharge, and most of the reactive gas molecules are activated. The reactive gas (activated species) excited and decomposed by the microwave discharge is introduced to the reaction chamber and reaches the surface of a substrate. At this time, some materials cause an etching reaction to some extent when the activated species come into contact with the substrate, but others do not cause an etching reaction simply by having the activated species reach to the surface of the substrate.

To induce the etching reaction, a photon beam irradiates to the substrate, so that the etching reaction takes place by virtue of the beam energy. The process of this reaction is understood to be that the etching reaction takes place by receiving energy, necessarily sufficient for generating the etching reaction, from the photon beam energy.

As to the material which causes somewhat of a reaction only by introducing the activated species, the etching rate at the irradiated region is improved by irradiating with the photon beam.

The foregoing and other objects, features and advantages of the invention will be apparent from the following more particular description of the preferred embodiments of the invention, as illustrated in the accompanying drawings.

BRIEF DESCRIPTION OF THE ACCOMPANYING DRAWINGS

DETAILED DESCRIPTION OF THE PREFERRED EMBODIMENTS

Figure 1:
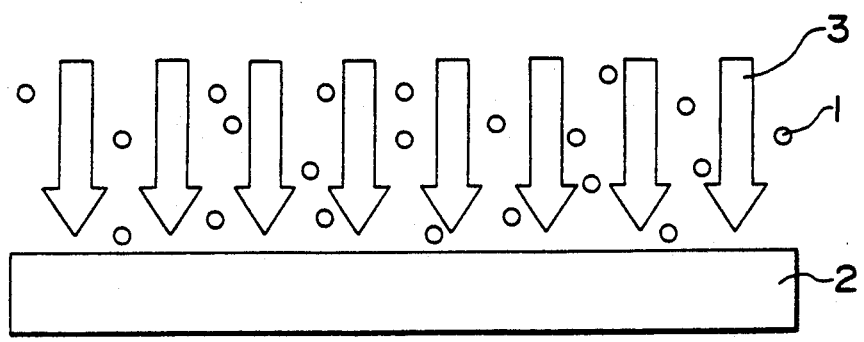
FIGS. 1 and 2 illustrate a cross-sectional explanatory view of etching reactions in accordance with one embodiment of the present invention.

In a dry etching method according to this invention, as shown in FIG. 1, a photon beam 3 irradiates a substrate 2 disposed in the atmosphere of a reactive gas 1 excited (activated) by a microwave discharge, thereby achieving an etching reaction.

Figure 2:
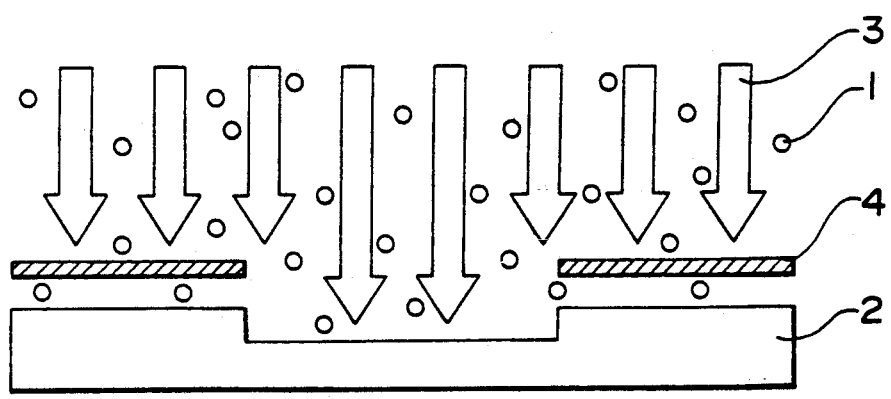

In this case, if the exposed surface of the substrate 2 is defined by providing an etch-proof mask 4, the irradiated area is exclusively and selectively etched as shown in FIG. 2.

Figure 3:
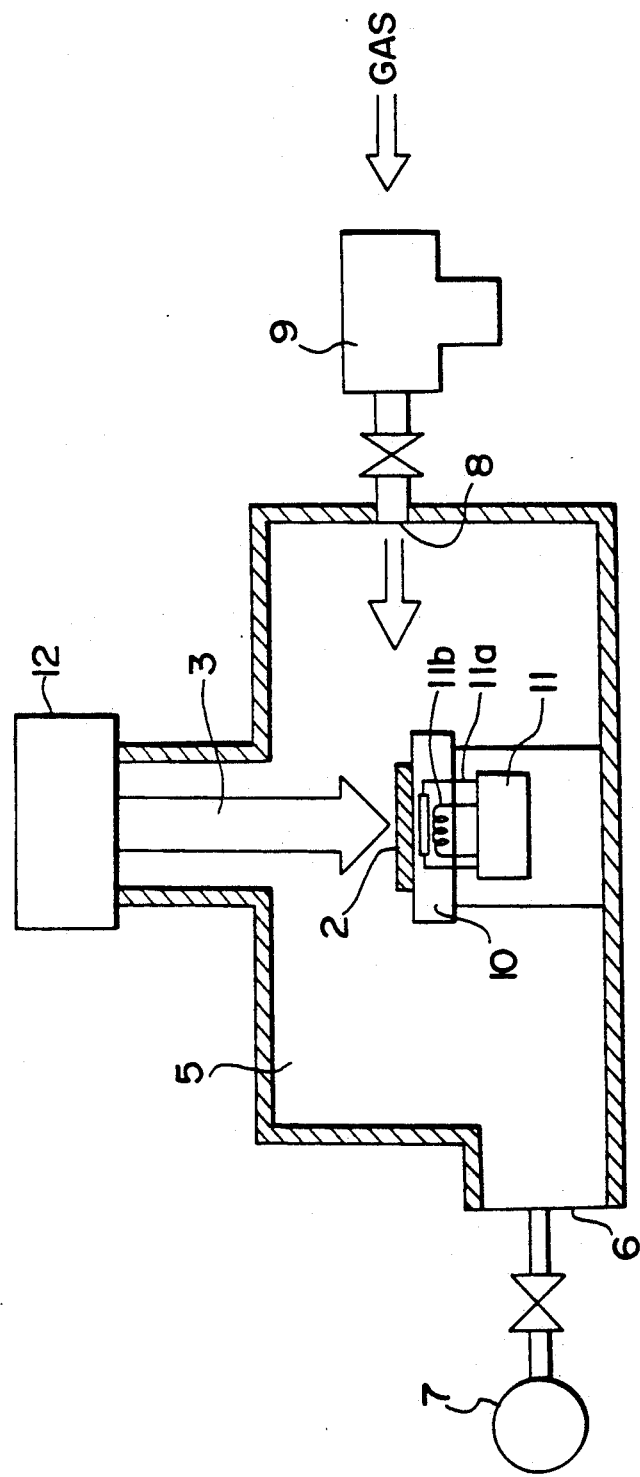
FIG. 3 illustrates a schematic cross-sectional view of a dry etching apparatus embodying the present invention.

FIG. 3 illustrates a dry etching apparatus in accordance with one embodiment of the present invention.

A reaction chamber 5 is hermetically sealed. The reaction chamber 5 is connected to a vacuum pump 7 by way of a gas outlet 6 and is also connected to a gas plasma generation section 9 by way of a gas inlet 8.

In the reaction chamber 5, there is provided a supporting portion 10, on which a processing material to be etched, that is a substrate 2, is disposed. Inside of the supporting portion 10, there are also provided a thermoregulator 11 made up of a cooling system 11a and a heater 11b.

Additionally, there is provided a photon beam source 12 for irradiating a photon beam 3 onto the substrate 2 above the supporting portion 10 in the reaction chamber 5.

The operation of the dry etching apparatus according to one embodiment of the present invention will now be described hereafter.

First, the air pressure of the reaction chamber 5 is reduced to approximately $10^{-7}$ to $10^{-8}$ by evacuating air therein with the vacuum pump 7. Then the temperature of the substrate 2 to be etched is adjusted to a given temperature in the range from room temperature to $-140°$ C.

With this condition, a reactive gas is excited by a microwave discharge (2.45 GHz) in the gas plasma generation section 9, and the excited reactive gas is introduced into the reaction chamber 5. Concurrently, the photon beam 3 is irradiated onto the substrate 2 in the reaction chamber 5. Thereby, the reaction of the reactive gas with the substrate 2 is promoted and the etching of the substrate is achieved.

Here, the gas plasma generation section 9 is a well known apparatus itself, and the EVENSON type cavity produced by EWIG Inc., Ltd. with a serial number 214L is employed in the embodiment of the present invention. As a power source, a power unit produced by EWIG Inc., Ltd. with a serial number MR-301 is used in this apparatus.

Embodiments accomplished by using the above-mentioned apparatus will be described hereunder.

The etched depth is measured by a surface roughness profiler, the measurement limit of which is about 50 Å.

First Embodiment

1. Substrate sample: n-type Si (100)
2. Sample temperature: 25° C.
3. Reactive gas: Sulfur hexafluoride (SF6) and Argon (Ar)
4. Gas pressure (gas pressure measured in the vicinity of the sample in the reaction chamber):
   SF6 . . . . . 0.05 Torr
   Ar . . . . . . 0.5 Torr
5. Output power of microwave (in the gas plasma generation section): 30W
6. Photon beam: VUV having a wavelength longer than 350 Å
7. Dosage of photon beam: 7,500 min.mAmp. (66 min)
8. Etch-proof mask: Stencil-type mask composed of a stainless steel (line: spacing=50 μm: 100 μm)
   The mask is disposed 0.3 mm spatially apart from the substrate.

The result of etching conducted under the above condition is as follows:

|  | Photon beam irradiated region | Photon beam non-irradiated region (area shielded by an etching-proof mask) |
|---|---|---|
| Etch rate | approx. 106 Å/min | approx. 76 Å/min |
| Etched depth | approx. 7,000 Å | approx. 5,000 Å |

Second Embodiment

1. Substrate sample: n-type Si (100)
2. Sample temperature: 25° C.
3. Reactive gas: Sulfur hexafluoride (SF6) and Argon (Ar)
4. Gas pressure (gas pressure measured in the vicinity of the sample in the reaction chamber):
   SF6 . . . 0.01 Torr
   Ar . . . . . . 0.5 Torr
5. Output power of microwave (in the gas plasma generation section): 15W
6. Photon beam: VUV having a wavelength longer than 350 Å
7. Dosage of photon beam: 10,000 min.mAmp. (54 min)
8. Etch-proof mask: Stencil-type mask composed of a stainless steel (line: spacing=50 μm: 100 μm)
   The mask is disposed 0.3 mm spatially apart from the substrate.

The result of etching conducted under the above condition is as follows:

|  | Photon beam irradiated region | Photon beam non-irradiated region (area shielded by an etching-proof mask) |
|---|---|---|
| Etch rate | approx. 56 Å/min | approx. 6 Å/min |
| Etched depth | approx. 3,000 Å | approx. 300 Å |

Third Embodiment

1. Substrate sample: n-type Si (100)
2. Substrate temperature: $-120°$ C.
3. Reactive gas: Sulfur hexafluoride (SF6) and Argon (Ar)
4. Gas pressure (gas pressure measured in the vicinity of the sample in the reaction chamber):
   SF6 . . . . . 0.05 Torr
   Ar . . . . . . 0.5 Torr
5. Output power of microwave (in the gas plasma generation section): 30W
6. Photon beam: VUV having a wavelength longer than 350 Å
7. Dosage of photon beam: 20,000 min.mAmp.(107 min)
8. Etch-proof mask: Stencil-type mask composed of a stainless steel (line: space=50 μm: 100 μm)
   The mask is disposed 0.3 mm spatially apart from the substrate.

The result of etching conducted under the above condition is as follows:

|  | Photon beam irradiated region | Photon beam non-irradiated region (area shielded by an etching-proof mask) |
|---|---|---|
| Etch rate | approx. 9 Å/min | approx. 5 Å/min |

-continued

|  | Photon beam irradiated region | Photon beam non-irradiated region (area shielded by an etching-proof mask) |
|---|---|---|
| Etched depth | approx. 1,000 Å | approx. 500 Å |

Fourth Embodiment

1. Substrate sample: SiC
2. Sample temperature: 25° C.
3. Reactive gas: Sulfur hexafluoride (SF6) and Argon (Ar)
4. Gas pressure (gas pressure measured in the vicinity of the sample in the reaction chamber):
   SF6 ..... 0.01 Torr
   Ar ...... 0.5 Torr
5. Output power of microwave (in the gas plasma generation section): 30W
6. Photon beam: Soft X-rays having a wavelength longer than 6 Å
7. Dosage of photon beam: 20,000 min.mAmp. (84 min)
8. Etch-proof mask: Stencil type mask composed of Ni.
   The mask is disposed 0.3 mm spatially apart from the substrate.

The result of etching conducted under the above condition is as follows:

|  | Photon beam irradiated region | Photon beam non-irradiated region (area shielded y an etching-proof mask) |
|---|---|---|
| Etch rate | approx. 21.4 Å/min | — |
| Etched depth | approx. 1,800 Å | Under the measurement limit |

Fifth Embodiment

1. Substrate sample: SiO2
2. Sample temperature: 25° C.
3. Reactive gas: Sulfur hexafluoride (SF6) and Argon (Ar)
4. Gas pressure (gas pressure measured in the vicinity of the sample in the reaction chamber):
   SF6 ..... 0.1 Torr
   Ar ...... 0.5 Torr
5. Output power of microwave (in the gas plasma generation section): 30W
6. Photon beam: Soft X-rays having a wavelength longer than 6 Å
7. Dosage of photon beam: 20,000 min.mAmp. (91 min)
8. Etch-proof mask: Stencil-type mask composed of Ni.
   The mask is disposed 0.3 mm spatially apart from the substrate.

The result of etching conducted under the above condition is as follows:

|  | Photon beam irradiated region | Photon beam non-irradiated region (area shielded by an etch-proof mask) |
|---|---|---|
| Etching rate | approx. 39.6 Å/min | — |
| Etched depth | approx. 3,600 Å | Under the measurement limit |

Sixth Embodiment

1. Substrate sample: W
2. Sample temperature: 25° C.
3. Reactive gas: Sulfur hexafluoride (SF6) and Argon (Ar)
4. Gas pressure (gas pressure measured in the vicinity of the sample in the reaction chamber):
   SF6 ..... 0.05 Torr
   Ar ...... 0.5 Torr
5. Output power of microwave (in the gas plasma generation section): 30W
6. Photon beam: Soft X-rays having a wavelength longer than 6 Å
7. Dosage of photon beam: 10,000 min.mAmp. (47 min)
8. Etch-proof mask: Stencil-type mask composed of Ni.
   The mask is disposed 0.3 mm spatially apart from the substrate.

The result of etching conducted under the above condition is as follows:

|  | Photon beam irradiated region | Photon beam non-irradiated region (area shielded by an etch-proof mask) |
|---|---|---|
| Etching rate | approx. 23.4 Å/min | — |
| Etched depth | approx. 1,100 Å | Under the measurement limit |

Seventh Embodiment

1. Substrate sample: Ta
2. Sample temperature: 25° C.
3. Reactive gas: Sulfur hexafluoride (SF6) and Argon (Ar)
4. Gas pressure (gas pressure measured in the vicinity of the sample in the reaction chamber):
   SF6 ..... 0.05 Torr
   Ar ...... 0.5 Torr
5. Output power of microwave (in the gas plasma generation section): 30W
6. Photon beam: Soft X-rays having a wavelength longer than 6 Å
7. Dosage of photon beam: 20,000 min.mAmp. (64 min)
8. Etch-proof mask: Stencil-type mask composed of Ni.
   The mask is disposed 0.3 mm spatially apart from the substrate.

The result of etching conducted under the above condition is as follows:

|  | Photon beam irradiated region | Photon beam non-irradiated region (area shielded by an etch-proof mask) |
|---|---|---|
| Etching rate | approx. 46.9 Å/min | — |
| Etched depth | approx. 3,000 Å | Under the measurement limit |

Eighth Embodiment

1. Substrate sample: Ti
2. Sample temperature: 25° C.
3. Reactive gas: Sulfur hexafluoride (SF6) and Argon (Ar)
4. Gas pressure (gas pressure measured in the vicinity of the sample in the reaction chamber):
   SF6 ..... 0.01 Torr Ar ...... 0.5 Torr
5. Output power of microwave (in the gas plasma generation section): 30W
6. Photon beam: Soft X-rays having a wavelength longer than 16 Å
7. Dosage of photon beam: 30,000 min.mAmp. (97 min)
8. Etch-proof mask: Non-contact stencil-type mask composed of a stainless steel. (line: spacing = 50 μm: 100 μm)

The mask is disposed 0.3 mm spatially apart from the substrate.

The result of etching conducted under the above condition is as follows:

|  | Soft X-rays irradiated region | Soft X-rays non-irradiated region (area shielded by an etch-proof mask) |
| --- | --- | --- |
| Etching rate | approx. 2.6 Å/min | — |
| Etched depth | approx. 250 Å | Under the measurement limit |

Ninth Embodiment

1. Substrate sample: WOx
2. Sample temperature: 25° C.
3. Reactive gas: Sulfur hexafluoride (SF6) and Argon (Ar)
4. Gas pressure (gas pressure measured in the vicinity of the sample in the reaction chamber):
   SF6 ..... 0.1 Torr
   Ar ...... 0.5 Torr
5. Output power of microwave (in the gas plasma generation section): 30W
6. Photon beam: Soft X-rays having a wavelength longer than 6 Å
7. Dosage of photon beam: 20,000 min.mAmp. (69 min)
8. Etch-proof mask: Stencil type mask composed of Ni.

The mask is disposed 0.3 mm spatially apart from the substrate.

The result of etching conducted under the above condition is as follows:

|  | Photon beam irradiated region | Photon beam non-irradiated region (area shielded by an etch-proof mask) |
| --- | --- | --- |
| Etching rate | approx. 65.2 Å/min | — |
| Etched depth | approx. 4,500 Å | Under the measurement limit |

Tenth Embodiment

1. Substrate sample: TaOx
2. Sample temperature: 25° C.
3. Reactive gas: Sulfur hexafluoride (SF6) and Argon (Ar)
4. Gas pressure (gas pressure measured in the vicinity of the sample in the reaction chamber):
   SF6 .... 0.01 Torr
   Ar ...... 0.5 Torr
5. Output power of microwave (in the gas plasma generation section): 30W
6. Photon beam: Soft X-rays having a wavelength longer than 6 Å
7. Dosage of photon beam: 20,000 min.mAmp. (76 min)
8. Etch-proof mask: Stencil type mask composed of Ni.

The mask is disposed 0.3 mm spatially apart from the substrate.

The result of etching conducted under the above condition is as follows:

|  | Photon beam irradiated region | Photon beam non-irradiated region (area shielded by an etch-proof mask) |
| --- | --- | --- |
| Etching rate | approx. 52.6 Å/min | approx. 2 Å/min |
| Etched depth | approx. 4,000 Å | approx. 150 Å |

Eleventh Embodiment

1. Substrate sample: TiOx
2. Sample temperature: 25° C.
3. Reactive gas: Sulfur hexafluoride (SF6) and Argon (Ar)
4. Gas pressure (gas pressure measured in the vicinity of the sample in the reaction chamber):
   SF6 ..... 0.01 Torr
   Ar ..... 0.5 Torr
5. Output power of microwave (in the gas plasma generation section): 30W
6. Photon beam: Soft X-rays having a wavelength longer than 6 Å
7. Dosage of photon beam: 20,000 min.mAmp. (72 min)
8. Etch-proof mask: Stencil-type mask composed of Ni.

The mask is disposed 0.3 mm spatially apart from the substrate.

The result of etching conducted under the above condition is as follows:

|  | Photon beam irradiated region | Photon beam non-irradiated region (area shielded by an etching-proof mask) |
| --- | --- | --- |
| Etching rate | approx. 11 Å/min | — |
| Etched depth | approx. 800 Å | Under the measurement limit |

Next, reference experiments in which etching is accomplished without exciting the reactive gas by the microwave radiation will be illustrated hereunder.

First Reference Experiment

1. Substrate sample: n-type Si (100)
2. Sample temperature: 25° C.
3. Reactive gas: Sulfur hexafluoride (SF6)
4. Gas pressure (gas pressure measured in the vicinity of the sample in the reaction chamber):
   SF6 .... 0.5 Torr
5. Photon beam: VUV having a wavelength longer than 350 Å
6. Dosage of photon beam: 10,000 min.mAmp. (74 min)
7. Etch-proof mask: Stencil type mask composed of a stainless steel (line: spacing = 50 μm: 100 μm)

The mask is disposed 0.3 mm spatially apart from the substrate.

The result of etching conducted under the above condition is as follows:

|  | Photon beam irradiated region | Photon beam non-irradiated region (area shielded by an etch-proof mask) |
| --- | --- | --- |
| Etching rate | — | — |
| Etched depth | Under the measurement | Under the measurement limit |

| | Photon beam irradiated region | Photon beam non-irradiated region (area shielded by an etch-proof mask) |
| --- | --- | --- |
| | | -continued |
| | | limit |

Second Reference Experiment

1. Substrate sample: SiC
2. Sample temperature: 25° C.
3. Reactive gas: Sulfur hexafluoride (SF6) and Argon (Ar)
4. Gas pressure: SF6 .... 0.1 Torr
   Ar ..... 0.5 Torr
5. Photon beam: Photon beam having a wavelength longer than 6 Å
6. Dosage of photon beam: 20,000 min.mAmp. (103 min)
7. Etch-proof mask: Stencil-type mask composed of Ni.
   The mask is disposed 0.3 mm spatially apart from the substrate.
   The result of etching conducted under the above condition is as follows:

| | Photon beam irradiated region | Photon beam non-irradiated region (area shielded by an etch-proof mask) |
| --- | --- | --- |
| Etching rate | approx. 1.46 Å/min | — |
| Etching depth | approx. 150 Å | Under the measurement limit |

Third Reference Experiment

1. Substrate sample: SiO2
2. Sample temperature: 25° C.
3. Reactive gas: Sulfur hexafluoride (SF6) and Argon (Ar)
4. Gas pressure: SF6 .... 0.05 Torr
   Ar ..... 0.5 Torr
5. Photon beam: Photon beam having a wavelength longer than 6 Å
6. Dosage of photon beam: 20,000 min.mAmp. (78 min)
7. Etch-proof mask: Stencil-type mask composed of Ni.
   The mask is disposed 0.3 mm spatially apart from the substrate.
   The result of etching conducted under the above condition is as follows:

| | Photon beam irradiated region | Photon beam non-irradiated region (area shielded by an etch-proof mask) |
| --- | --- | --- |
| Etching rate | approx. 10.3 Å/min | — |
| Etched depth | approx. 800 Å | Under the measurement limit |

Fourth Reference Experiment

1. Substrate sample: W
2. Sample temperature: 25° C.
3. Reactive gas: Sulfur hexafluoride (SF6) and Argon (Ar)
4. Gas pressure: SF6 .... 0.05 Torr
   Ar ..... 0.5 Torr
5. Photon beam: Photon beam having a wavelength longer than 6 Å
6. Dosage of photon beam: 20,000 min.mAmp. (85 min)
7. Etch-proof mask: Stencil-type mask composed of Ni.
   The mask is disposed 0.3 mm spatially apart from the substrate.
   The result of etching conducted under the above condition is as follows:

| | Photon beam irradiated region | Photon beam non-irradiated region (area shielded by an etch-proof mask) |
| --- | --- | --- |
| Etching rate | approx. 0.6 Å/min | — |
| Etched depth | approx. 50 Å | Under the measurement limit |

Fifth Reference Experiment

1. Substrate sample: Ta
2. Sample temperature: 25° C.
3. Reactive gas: Sulfur hexafluoride (SF6) and Argon (Ar)
4. Gas pressure: SF6 .... 0.05 Torr
   Ar ..... 0.5 Torr
5. Photon beam: Photon beam having a wavelength longer than 6 Å
6. Dosage of photon beam: 20,000 min.mAmp. (94 min)
7. Etch-proof mask: Stencil-type mask composed of Ni.
   The mask is disposed 0.3 mm spatially apart from the substrate.
   The result of etching conducted under the above condition is as follows:

| | Photon beam irradiated region | Photon beam non-irradiated region (area shielded by an etch-proof mask) |
| --- | --- | --- |
| Etching rate | — | — |
| Etched depth | Under the measurement limit | Under the measurement limit |

Sixth Reference Experiment

1. Substrate sample: Ti
2. Sample temperature: 25° C.
3. Reactive gas: Sulfur hexafluoride (SF6) and Argon (Ar)
4. Gas pressure (gas pressure measured in the vicinity of the sample in the reaction chamber):
   SF6 .... 0.1 Torr
   Ar ..... 0.5 Torr
5. Photon beam: Photon beam having a wavelength longer than 16 Å
6. Dosage of photon beam: 30,000 min.mAmp. (110 min)
7. Etching proof mask: Stencil-type mask composed of a stainless steel (line: spacing=50 μm: 100 μm)
   The mask is disposed 0.3 mm spatially apart from the substrate.
   The result of etching conducted under the above condition is as follows:

| | Photon beam irradiated region | Photon beam non-irradiated region (area shielded by an etch-proof mask) |
| --- | --- | --- |
| Etching rate | — | — |

-continued

|  | Photon beam irradiated region | Photon beam non-irradiated region (area shielded by an etch-proof mask) |
|---|---|---|
| Etched depth | Under the measurement limit | Under the measurement limit |

Seventh Reference Experiment

1. Substrate sample: WOx
2. Sample temperature: 25° C.
3. Reactive gas: Sulfur hexafluoride (SF6) and Argon (Ar)
4. Gas pressure: SF6 .... 0.1 Torr
   Ar ..... 0.5 Torr
5. Photon beam: Photon beam having a wavelength longer than 6 Å
6. Dosage of photon beam: 20,000 min.mAmp. (68 min)
7. Etch-proof mask: Stencil-type mask composed of Ni.
   The mask is disposed 0.3 mm spatially apart from the substrate.

The result of etching conducted under the above condition is as follows:

|  | Photon beam irradiated region | Photon beam non-irradiated region (area shielded by an etch-proof mask) |
|---|---|---|
| Etching rate | approx. 1.5 Å/min | — |
| Etched depth | approx. 100 Å | Under the measurement limit |

Eighth Reference Experiment

1. Substrate sample: TaOx
2. Sample temperature: 25° C.
3. Reactive gas: Sulfur hexafluoride (SF6) and Argon (Ar)
4. Gas pressure: SF6 .... 0.01 Torr
   Ar ..... 0.5 Torr
5. Photon beam: Photon beam having a wavelength longer than 6 Å
6. Dosage of photon beam: 20,000 min.mAmp. (84 min)
7. Etch-proof mask: Stencil-type mask composed of Ni.
   The mask is disposed 0.3 mm spatially apart from the substrate.

The result of etching conducted under the above condition is as follows:

|  | Photon beam irradiated region | Photon beam non-irradiated region (area shielded by an etch-proof mask) |
|---|---|---|
| Etching rate | approx. 4.2 Å/min | — |
| Etched depth | approx. 350 Å | Under the measurement limit |

Ninth Reference Experiment

1. Substrate sample: TiOx
2. Sample temperature: 25° C.
3. Reactive gas: Sulfur hexafluoride (SF6) and Argon (Ar)
4. Gas pressure: SF6 .... 0.01 Torr
   Ar ..... 0.5 Torr
5. Photon beam: Photon beam having a wavelength longer than 6 Å
6. Dosage of photon beam: 20,000 min.mAmp. (80 min)
7. Etch-proof mask: Stencil-type mask composed of Ni.
   The mask is disposed 0.3 mm spatially apart from the substrate.

The result of etching conducted under the above condition is as follows:

|  | Photon beam irradiated region | Photon beam non-irradiated region (area shielded by an etch-proof mask) |
|---|---|---|
| Etching rate | approx. 3.8 Å/min | — |
| Etched depth | approx. 300 Å | Under the measurement limit |

As is apparent from the above-listed reference experiments, the etching rate (or the etched depth) in the reference experiments only using a photon beam is lower than that in the embodiments utilizing the microwave radiation.

With respect to the embodiments, it will be desirable to set the value of the items in the experiment condition as follows:
Pressure of SF6 ........ 10 m Torr to 100 m Torr
Pressure of Ar ......... 500 m Torr
Output power of microwave .... 15 W to 30 W It should be noted that the dry etching method according to this invention can be applied for etching other kinds of material used for semiconductor apparatus such as other metals, insulating materials and the like.

In accordance with the present invention, with respect to the dry etching which requires an accurate anisotropic property and an area selectivity, an etching is accomplished selectively in a region to be irradiated with holding high accuracy of anisotropic property Since etching is achieved by using active species generated in the plasma generation section which locates separated from a sample substrate and no high energy charged species are employed, the damages to the etching profile caused by the high energy charged species will not occur.

Further, an etching rate can be improved by leading a microwave discharge to activate the reactive gas in the reaction chamber.

Namely, by the adoption of the present invention, an etching which causes no damage due to the high energy charged species can be achieved with holding a high anisotropic property at a high etching rate.

What is claimed is:
1. A dry etching method comprising the steps of:
   (a) activating an etching gas consisting of SF$_6$ and Ar by using a microwave;
   (b) disposing an etch-proof photomask having an opening above a surface of a processing material composed of Si to be etched so that the mask is spaced from the surface; and
   (c) irradiating a photon beam of vacuum ultraviolet radiation, for exciting a reaction, onto the surface of the processing material to be etched in a condition that there exists an activated etching gas, thereby achieving an etching of said processing material to be etched in an area selected by the opening in the photomask to be irradiated by said photon beam, and cooling said processing material simultaneously with irradiating by said photon beam.
2. A dry etching method according to claim 1, wherein the photomask is composed of Ni or stainless steel.

* * * * *